United States Patent [19]
Osono et al.

[11] Patent Number: 5,614,760
[45] Date of Patent: Mar. 25, 1997

[54] TAPE CARRIER PACKAGE SEMICONDUCTOR DEVICE

[75] Inventors: Mitsuaki Osono, Sakurai; Naoyuki Tajima, Kitakatsuragi-gun; Katsunobu Mori, Nara, all of Japan

[73] Assignee: Sharp Kabushiki Kaisha, Osaka, Japan

[21] Appl. No.: 386,051

[22] Filed: Feb. 7, 1995

[30]     Foreign Application Priority Data

Jun. 23, 1994    [JP]    Japan ................................... 6-141584

[51]  Int. Cl.⁶ .......................... H01L 23/495; H01L 23/34; H01L 23/48
[52]  U.S. Cl. ........................ 257/668; 257/666; 257/674; 257/723; 257/724; 257/773
[58]  Field of Search ................................... 257/666, 668, 257/669, 671, 723, 724, 773, 673, 674

[56]            References Cited

U.S. PATENT DOCUMENTS 4,996,583   2/1991   Hatada ..................... 257/668
5,157,478  10/1992   Ueda et al. ............... 257/668
5,250,842  10/1993   Ikeda ....................... 257/668

FOREIGN PATENT DOCUMENTS 53-103659  8/1978  Japan .
 5152486   6/1993  Japan ..................... 257/668

*Primary Examiner*—Mahshid D. Saadat
*Assistant Examiner*—Valencia Martin Wallace
*Attorney, Agent, or Firm*—Nixon & Vanderhye P.C.

[57]            ABSTRACT

In a TCP (tape carrier package) semiconductor device having opposing, inner lead arrays bonded to a semiconductor device, a projection or projections are provided on each of the inner leads disposed at intervals of a greater distance on one side of the semiconductor, within a range for allowing the resin to flow out.

12 Claims, 7 Drawing Sheets

TAPE CARRIER PACKAGE SEMICONDUCTOR DEVICE

BACKGROUND OF THE INVENTION (1) Field of the Invention

The present invention relates to a tape carrier package semiconductor device (to be referred to hereinafter as a TCP semiconductor device) in which a semiconductor chip is packed in a form of a tape carrier package.

(2) Description of the Related Art

FIG. 1A is a plan view showing a pattern of a carrier tape for a prior art TCP semiconductor device. FIG. 1B is a sectional view taken on 20–20 in FIG. 1A of a TCP semiconductor device using the carrier tape in which the carrier tape is sealed with a solventless type resin. In FIGS. 1A and 1B, the semiconductor device is composed of a semiconductor chip 12, inner leads 13, a carrier tape 15 with a device hole 11 and a sealing resin 16.

In the prior art TCP semiconductor device, as shown in FIG. 1A, the inner leads 13 are bonded to unillustrated pads on the semiconductor chip 12. Thereafter, the sealing resin 16 is applied thereon. The resin applied flows down due to the weight thereof through the clearance formed between the edge of the device hole 11 and the edge of the semiconductor chip 12 toward the opposite side of the resin-application.

The number of pads (not shown) provided on different sides of the semiconductor chip 12 rarely correspond with each other and the number of inner leads 13 connected on the different sides are not the same, as shown in FIG. 1A. Further, each inner lead 13 generally has a different width from others. Therefore, the space allowing the resin to flow out differs for each side.

This difference in the spaces, allowing the resin to flow out directly, causes a difference in flowed resin quantity, making uneven the feature on the backside of the application after the resin is cured. More explicitly, as shown in FIG. 1B, the sealing resin 16 flows out in bulk through wide clearances between sparsely provided inner leads 13 while the resin flows out in a small amount through the narrow clearances between densely provided inner leads 13. The flow-out amount of the sealing resin 16 changes depending upon the total clearance area between inner leads 13 bonded to pads (not shown) on each side of the semiconductor chip 12 if the sealing resin 16 has a constant resin-leveling property which represents easiness of flowing of the sealing resin 16 and the spaces of the device hole 11 is equally allotted on different sides.

For the reasons described above, it rarely happens that the sealing resin 16 is formed uniformly on the backside of the application on the pattern of the carrier tape 15 shown in FIG. 1A. That is, a large amount of resin flowed out along the sides having greater spaces, therefore, bulky resin portions are formed in those areas on the backside of the application, causing adverse effects for making the TCP semiconductor device compact and thin. On the other hand, the places where a less amount of the resin is provided, not only bring about a problem of the size but also degradation in strength and moisture resistance etc. of the device.

Several methods have been proposed to deal with the problem described above. That is, in the prior art, slits are provided on the resin flow-out side for holding back the sealing resin; a resin having thixotropy is applied to form a dam for preventing the flow of the resin; a frame for holding back the resin is provided to control the flow of the resin; and the viscosity of the resin is adjusted by controlling the amount and size of a filler added to control the resin flow.

Further, it is disclosed in Japanese Utility Model Application Laid-open Sho 53 No. 103,659 that in order to prevent leakage of the resin, cantilevered projected portions are provided for the inner leads on the backside thereof in the clearance between the edges of the semiconductor chip and the device hole so as to block the portions where no inner lead exists.

Any of the above methods, however, requires an increased number of steps resulting in a lower of yield and raising the cost of the final product.

In the means described in Japanese Utility Model Application Laid-open Sho 53 No. 103,659 in which cantilevered projected portions are provided, the projected portions are extended to the edge of the device hole so that degrees of flexure differ between lead portions with projected portions and lead portions with no projected portion. This structure may cause the resin in the lead portions to crack. The situation will be described referring to a partially enlarged view in FIG. 2. Since the amount of the flowed resin is controlled by varying the widths of inner leads 13, some inner leads have a greater width, other inner leads have a smaller width in the portions where each inner lead 13 is connected to the edge of the carrier tape 15. Accordingly, the flexibility or rigidity distribution of inner leads 13 becomes unequal. As a result, stresses which are caused when the semiconductor chip 12 is bonded tend to concentrate on particular points (portions encircled by broken lines in FIG. 2), possibly breaking the inner leads 13. Therefore, this configuration is not a favorable one.

As an improved method from the above prior art, based on the size of the clearance of the device hole 11 in which inner leads 13 are sparsely provided, the size of the clearance of the device hole 11 in which inner leads 13 are densely provided is determined so that the amount of the resin flowing out may be equal in both the areas. This method improves the controllability of the resin range thereby eliminating the problem relating the size of the product. However, each model of so constructed devices requires a dedicated cutout die for forming a specific device hole 11, resulting in increased cost for producing the die for each model.

SUMMARY OF THE INVENTION

It is therefore an object of the present invention to provide a TCP semiconductor device wherein the flow-out amount of a resin can be controlled without demanding extra cost or without adjusting the viscosity of the resin used.

The above object can be achieved by the following features of the present invention.

That is, a TCP semiconductor device of the present invention includes: a carrier tape having a device hole; a semiconductor substrate disposed inside the device hole; and a plurality of inner leads provided between the semiconductor substrate and the tape carrier, and is constructed such that, when the semiconductor substrate is disposed inside the device in such a manner that a first side and a second side of the semiconductor substrate are spaced by the same distance from respective, opposing edges of the device hole while the interval of inner leads arrayed on said first side of the semiconductor substrate is greater than the interval of inner leads arrayed on said second side of the semiconductor substrate, one projection or a pair of projections are provided on one side or both sides of each inner lead on the first side, in a range from the first side of the semiconductor substrate to the opposing edge of the device hole.

In the above configuration of the TCP semiconductor device of the present invention, it is effective that the contour of the distal end of the projection is shaped in a line parallel to that of an adjoining inner lead. It is also effective in the above configuration that the total area of the projections is determined so that the total of clearance areas between inner leads on the first side may be equal to the total of clearance areas between inner leads on the second side.

According to the above configuration, the projections provided for the inner leads disposed at intervals of a greater distance serve to block the clearance area between the inner leads so as to reduce the space for allowing the resin to flow out, whereby the amount of the flow-out resin can be controlled.

DESCRIPTION OF THE PREFERRED EMBODIMENTS

The present invention will hereinafter be described in detail referring to the various embodiments.

Figure 4A:
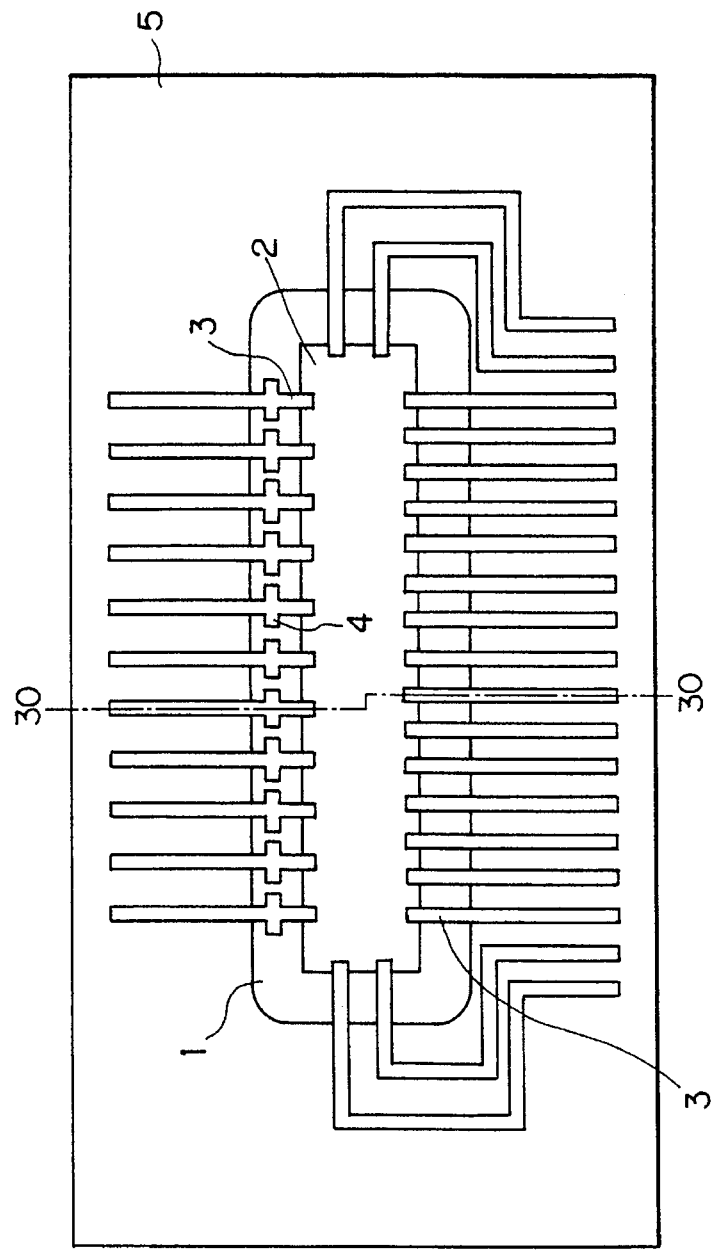
FIG. 4A is a plan view showing a carrier tape pattern of an embodiment of the present invention.
Figure 4B:
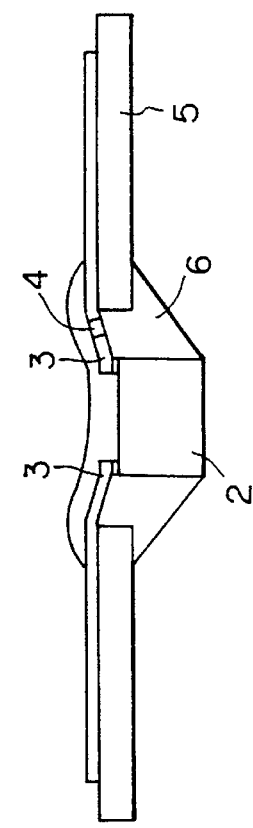
FIG. 4B is a sectional view of a TCP semiconductor device in which the carrier tape shown in FIG. 4A is sealed with a cured resin.
Figure 5:
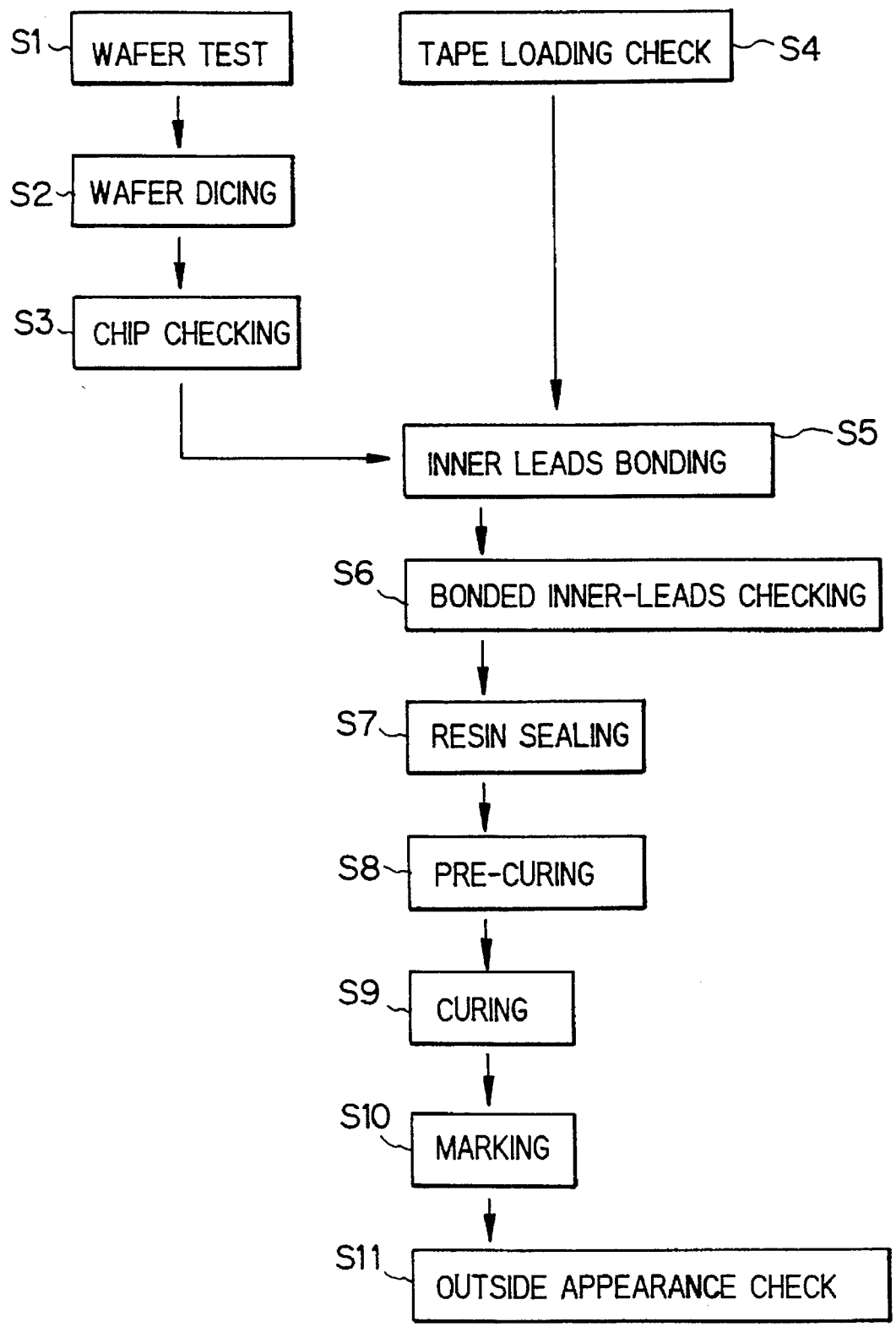
FIG. 5 is a flowchart showing the producing steps of a tape carrier package semiconductor device.
Figure 6:
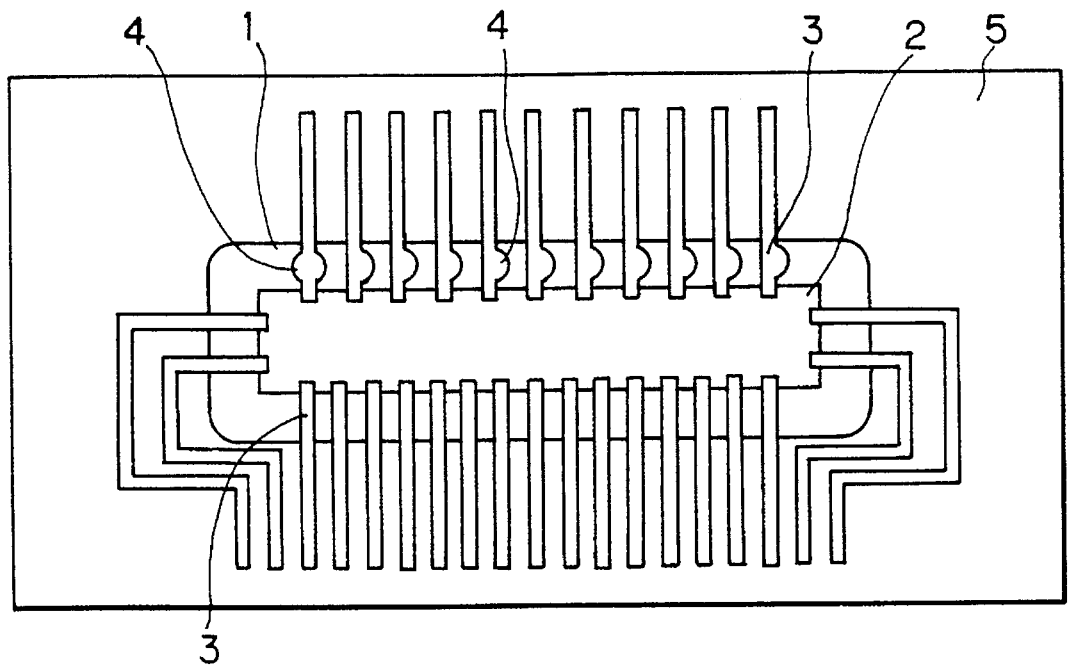
FIG. 6 is a plan view showing a carrier tape pattern of another embodiment of the present invention.

FIG. 4A is a plan view showing a carrier tape pattern of an embodiment of the present invention. FIG. 4B is a sectional view taken on 30–30 in FIG. 4A of the carrier tape pattern applied with a resin. FIG. 5 is a flowchart showing producing steps of a tape carrier package semiconductor device. Each configuration shown in FIGS. 6 through 9 is composed of a semiconductor substrate or chip 2, inner leads 3 with projections 4, a carrier tape 5 with a device hole 1 and a sealing resin 6.

The present invention is characterized in that control on the flow-out amount of the sealing resin 6 is done by providing projections 4 for inner leads 3.

Figure 7:
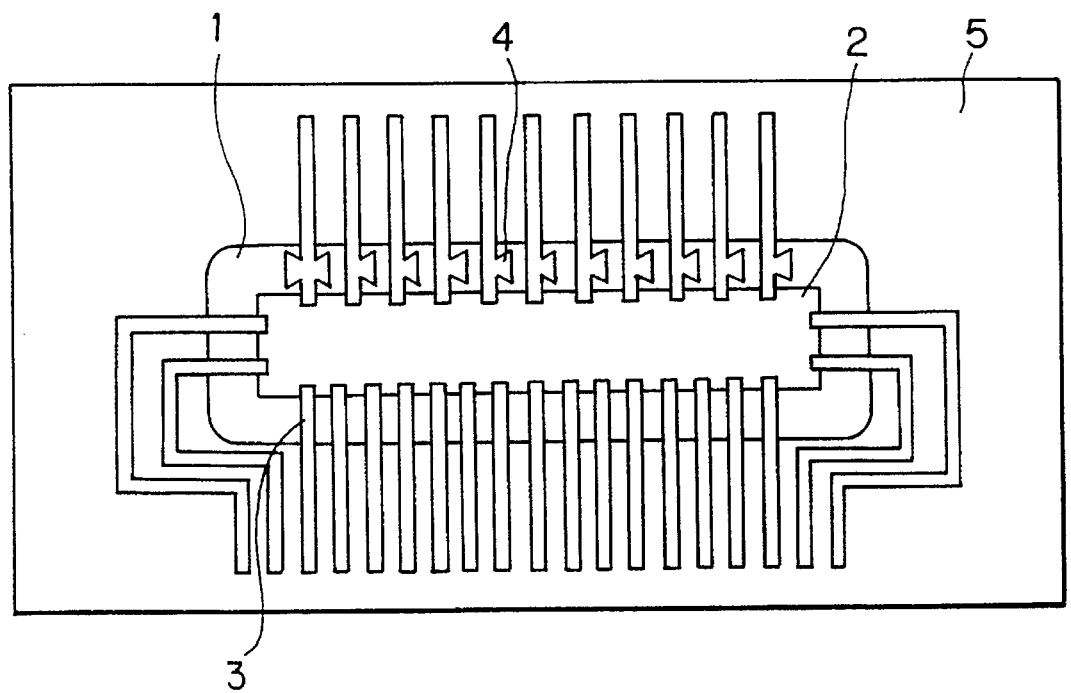
FIG. 7 is a plan view showing a carrier tape pattern of a further embodiment of the present invention.
Figure 8:
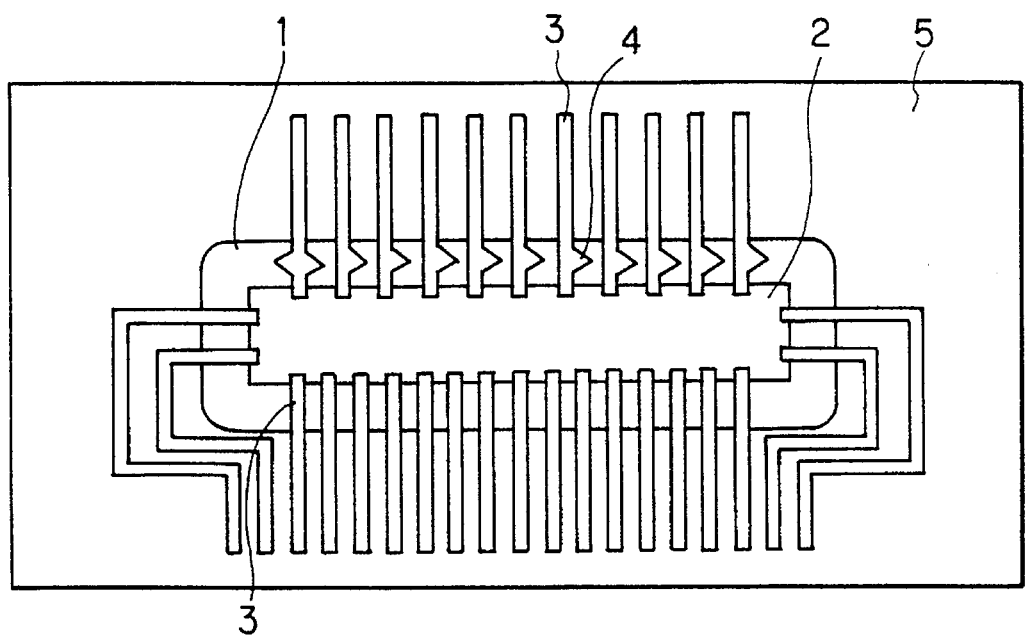
FIG. 8 is a plan view showing a carrier tape pattern of still further embodiment of the present invention.

Projections 4 to be provided for inner leads 3 may be formed in any shape inclusive of those shown in FIGS. 4A and 4B and FIGS. 6 to 9, but are preferably shaped in such a manner that the strength of electric fields generated by a projection 4 against an adjoining inner lead 3 may not be sharply increased. Specifically, as shown in FIG. 4A or FIG. 7, it is preferable that the contour of the distal end of a projection 4 is shaped in a line parallel to that of an adjoining inner lead 3.

Figure 9:
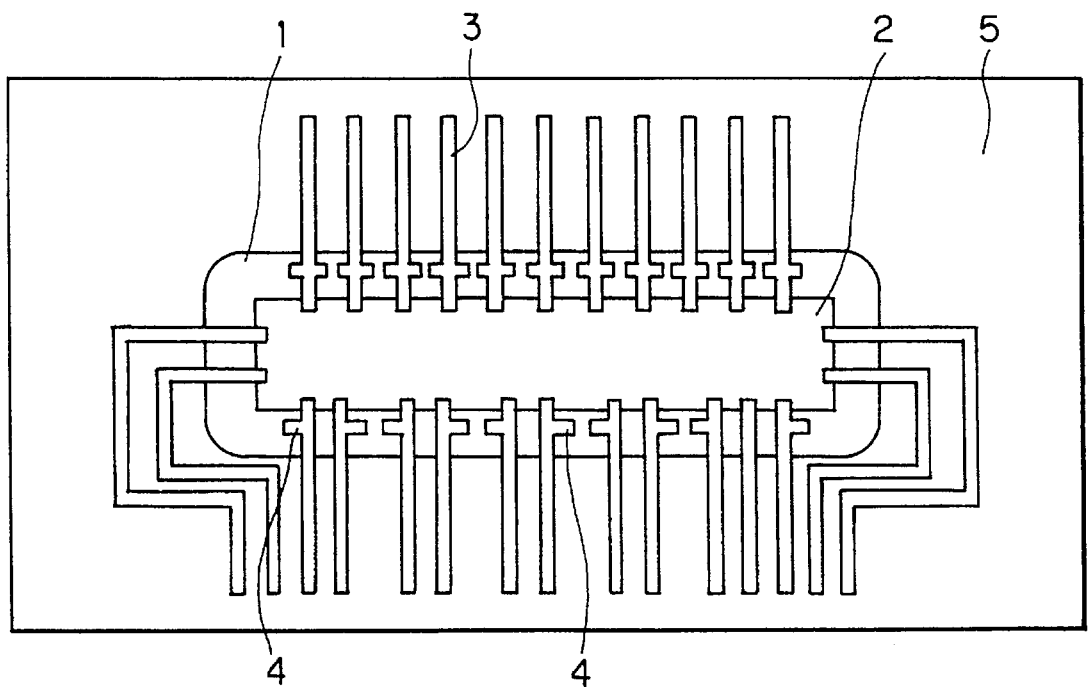
FIG. 9 is a plan view showing a carrier tape pattern of still another embodiment of the present invention.

If there are variations in the distances between adjoining inner leads 3 on one side of the semiconductor device 2, a tape carrier pattern may be designed, for example, as shown in FIG. 9, where a projection 4 is provided on the side of each inner lead 3 facing a broader interspace. Here, in FIG. 9, all the inner leads 3 arrayed on the both long sides are provided with projections 4. This configuration makes possible a more exact control on the flow-out amount of the resin.

A projection 4 must be sized so as neither to come in contact with the edge of the semiconductor device 2 nor an adjoining inner lead 3 having a potential difference to the projection. Further, insulating resistance between neighboring inter leads 3 is required to be taken at least $10^{10}$ $\Omega$ or more.

A minimum amount of the sealing resin 6 required and sufficient for covering all the inner leads 3 and the semiconductor chip 2 is set up as a proper amount of the resin. A preferable viscosity of the sealing resin 6 at the molten state is 80 poise or more, more preferably 80 to 100 poise. Epoxy resins, silicone resins, polyimide resins and the like may preferably be used as the sealing resin 6. Although, the description of this embodiment is made in a case where a solventless resin is used as the sealing resin 6, any resin even containing a solvent can be used as the sealing resin 6 as long as the resin has a viscosity falling within the above-mentioned range. A resin to be used should have a leveling property of 6 to 8.5 mm or thereabout. The 'leveling property' used here is represented by a diameter of a resin spread range formed when a 10 mg drop of the sealing resin 6 is provided over a material called 'UPILEX (a trade name of a product of UBE INDUSTRY, LTD.)'

A TCP semiconductor device of the present invention is produced following the producing steps as shown in FIG. 5. That is, after the completion of a wafer testing step S1, a wafer dicing step S2, a chip checking step S3 and a tape load checking step S4, inner leads 3 are bonded, as shown in FIGS. 4A and 4B, to a semiconductor chip 2 (at an inner lead bonding step S5). The thus bonded inner leads are checked at a step S6. Then, a resin having a viscosity of 200 to 1500 poise at normal temperature is provided at a step S7 to seal the semiconductor chip 2 with the inner leads bonded thereto. The thus provided resin element is pre-cured at a step S8 at a temperature of 100° to 180° C. for five to 60 minutes so that the viscosity of the resin at the molten state becomes 80 to 100 poise. Next, a curing treatment is effected at S9 in which the pre-cured resin is hardened at a temperature of 100° to 180° C. for 2 to 12 hours. Finally, the product is marked at a step S10 and checked on the outside appearance at a step S11.

Figure 10:
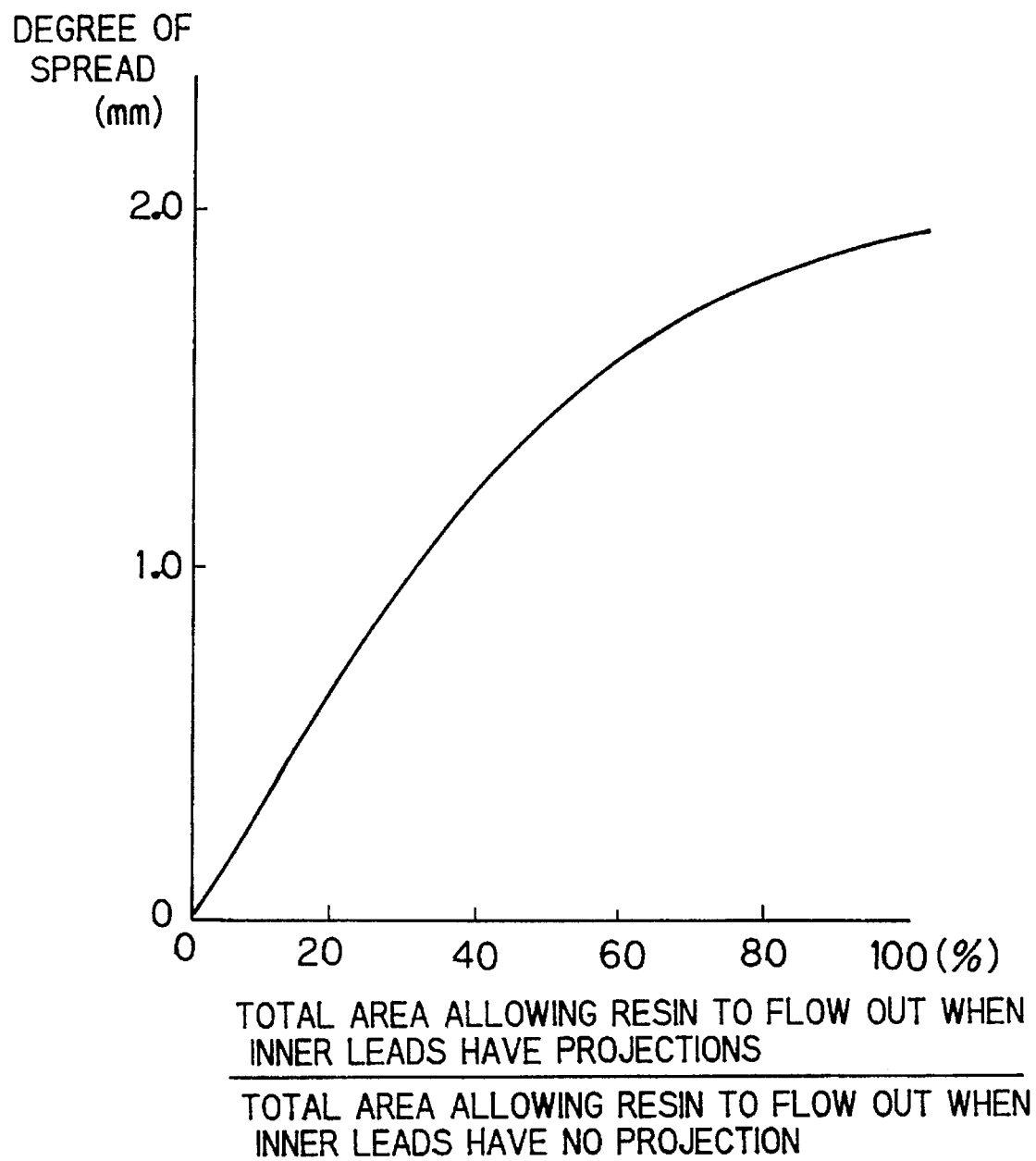
FIG. 10 is a chart showing a correlation between the inter-clearance area of inner leads and the spread of a sealing resin.

FIG. 10 shows a correlation between the inter-clearance area of inner leads and the spread of the sealing resin. A TCP semiconductor device of the present invention was prepared such that, with 60 inner leads having projections of 0.24 mm², arrayed on each long side of 13.12 mm in length of a semiconductor chip and extended across a clearance of 0.1 mm long from the edge of the semiconductor chip to the edge of the device hole and the total clearance area being reduced by 24% with the projections 4, this structure was covered with a sealing resin and cured at a temperature of 145° C. for 15 minutes. The resin range on the backside of the resin application could be reduced by 5% in the thus formed product as compared to the resin range of a prior art product using a carrier tape 5 having inner leads 3 arrayed with the same distance apart from each other but having no projection 4. In FIG. 10, the horizontal axis represents a ratio of a total area allowing a resin to flow out when the inner leads have projections, to a total area allowing a resin to flow out when the inner leads have no projection. The vertical axis indicates a length of the spread of the sealing resin 6 from the edge of the semiconductor chip 2.

Figure 1A:
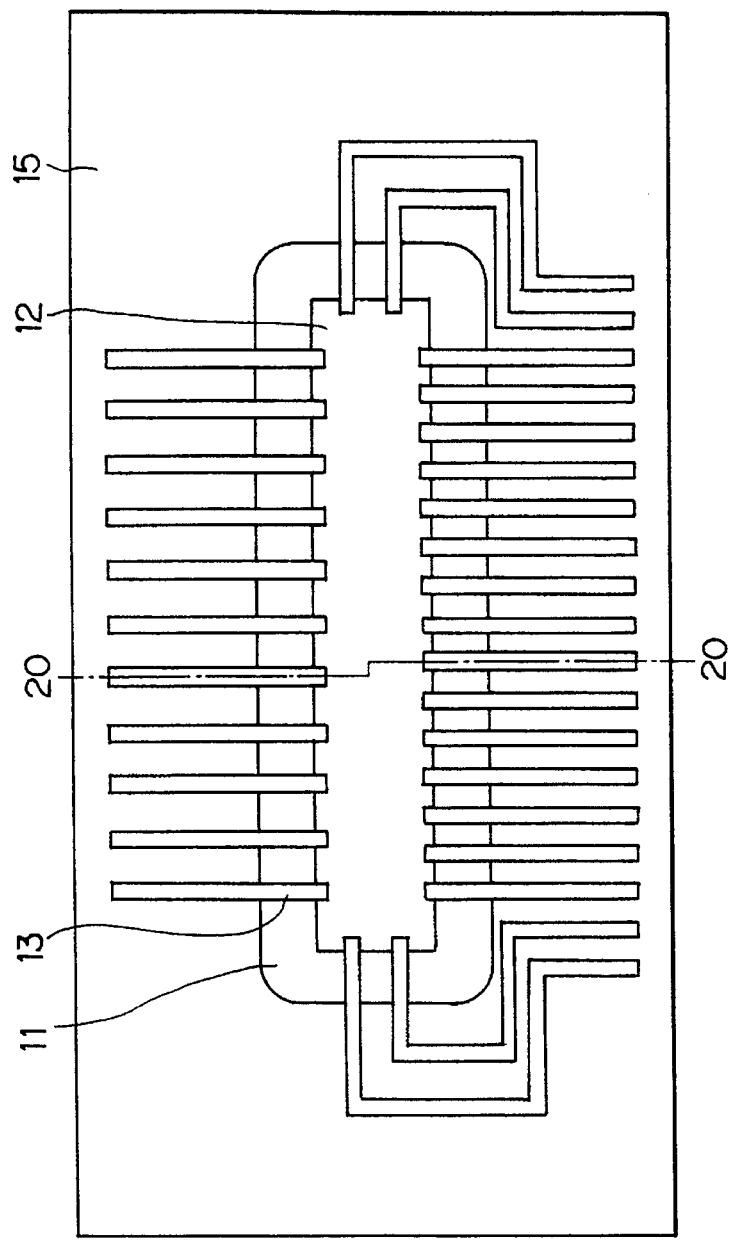
FIG. 1A is a plan view of a pattern of a prior art carrier tape used in a TCP semiconductor device.
Figure 1B:
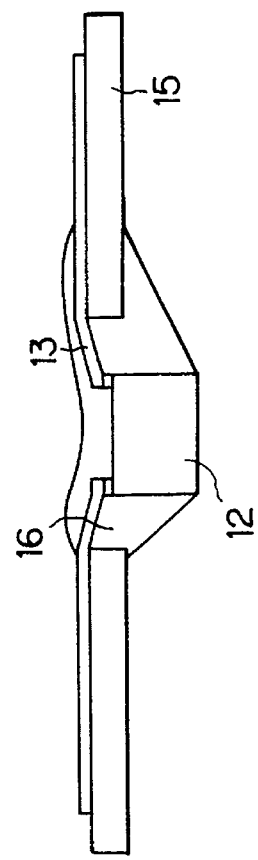
FIG. 1B is a sectional view of a TCP semiconductor device in which the carrier tape shown in FIG. 1A is sealed with a cured resin.
Figure 2:
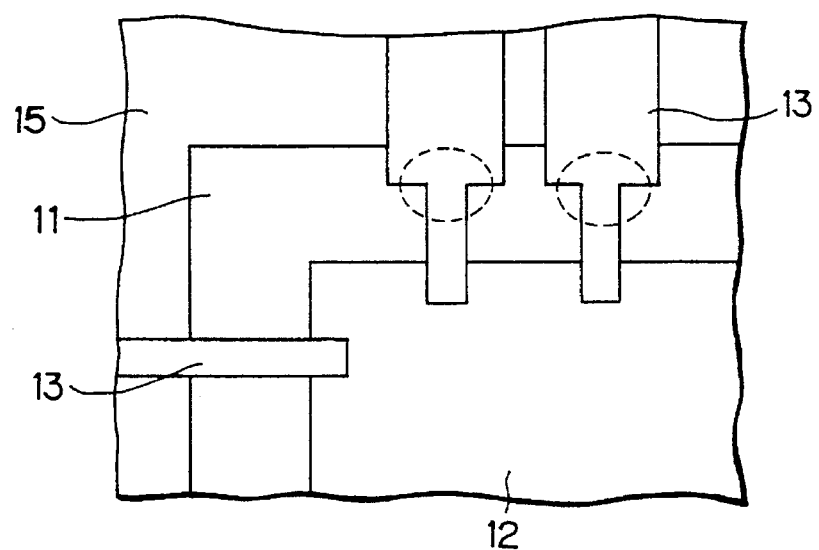
FIG. 2 is a partially enlarged plan view showing a carrier tape pattern for illustrating a problem in another prior art carrier tape.
Figure 3:
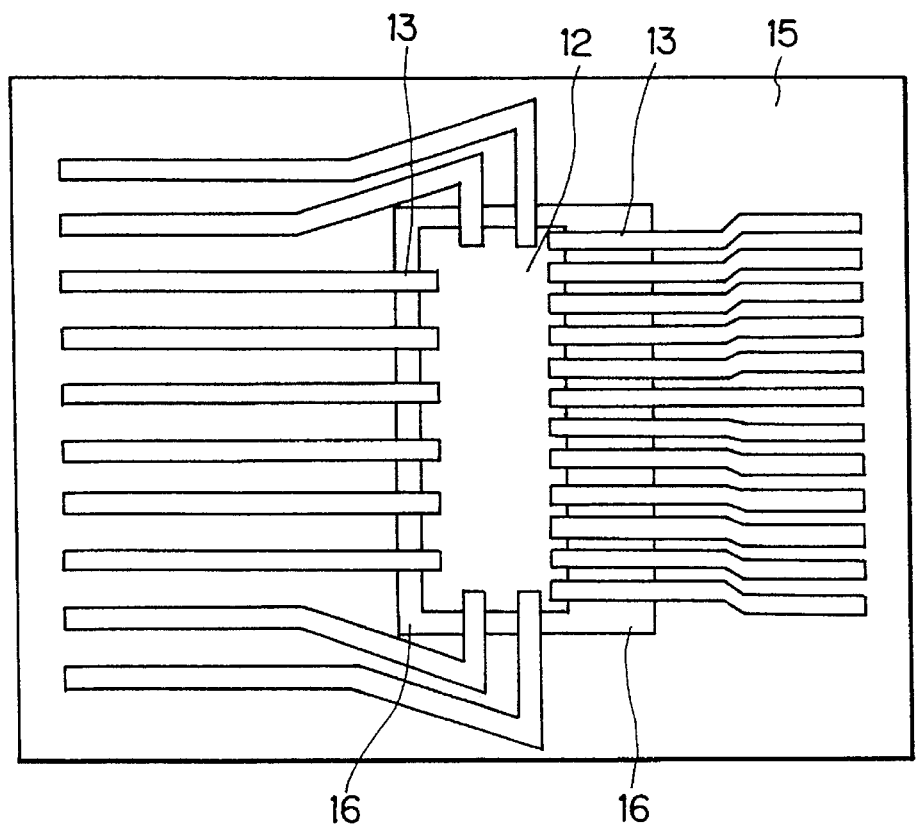
FIG. 3 is a plan view showing an improved carrier tape pattern of a prior art.

Here, comparing the present invention to the prior art configuration shown in FIG. 2, the inner lead 13 in the prior art has a wider part from the edge of the carrier tape 15 to the middle of the device hole 11 while the inner lead 3 of the present invention has a projection or projections 4 only within the range over the device hole 1.

As detailed heretofore, the present invention has the following effects.

According to the present invention, since the unevenness of the thickness of the sealing resin can be inhibited on both the application side and the backside of the application as compared to the prior art configuration, it is possible to stably provide products having designed resin dimensions. Therefore, appearance defects such as spread of the sealing resin beyond the resin range specified and off-specification of the resin in thickness can be decreased. Further, in the prior art configuration, the resin would flow out partially, forming part with excessively reduced region in the resin thickness. This would cause cracks due to mechanical stresses. In contrast, the products of the present invention are improved in crack-resistance and moisture-resistance because the sealing resin can be made uniformly. Further, the yield or productivity in mass production can be improved making it possible to reduce the cost of the final product.

Since the flowing amount of the resin to the backside of the application can be controlled, it is possible to limit the applied amount of the resin to a minimum degree. Therefore, the outside dimensions of the product can be made small to contribute to making compact such devices as a liquid crystal driver and the like. Further the resin to be used can be economized to thereby reduce the cost.

Although control over the applying pressure of the resin and optimization of the drawing speed of the resin have been required conventionally for adjusting the applied resin amount onto specified sides, all these requirement are no more needed making it possible to reduce the processing time.

Further, according to the present invention, it is possible to inhibit a sharp increase in strength of electric fields between neighboring inner leads and it is also possible to apply the resin in a uniformly controlled amount on both the application side and the backside of the application. These features of the present invention are really effective.

What is claimed is:

1. A tape carrier package semiconductor device comprising:

a carrier tape having a device hole;

a semiconductor substrate disposed inside said device hole; and a plurality of inner leads arrayed between a first side and a second side of said semiconductor substrate and said carrier tape, characterized in that, said semiconductor substrate is disposed inside said device hole in such a manner that said first side and said second side of said semiconductor substrate are spaced by substantially the same distance from respective opposing edges of said device hole, the inner leads arrayed on said first side of said semiconductor substrate having a greater interval between leads than the interval between the leads of the inner leads arrayed on said second side of said semiconductor substrate, one projection or a pair of projections provided on one side or both sides of each inner lead on said first side and in an area between said first side of said semiconductor substrate and the opposing edge of said device hole.

2. A tape carrier package semiconductor device according to claim 1 wherein each said projection has a distal end contour shape that is in a line parallel to that of an adjoining inner lead.

3. A tape carrier package semiconductor device according to claim 1 wherein the total area of said projections is determined so that the total clearance area between inner leads on said first side is substantially equal to the total clearance area between inner leads on said second side.

4. A tape carrier package semiconductor device according to claim 1 wherein one projection or a pair of projections are provided on one side or both sides of each inner lead on said second side, in a range from said second side of said semiconductor substrate to the opposing edge of said device hole.

5. A tape carrier package semiconductor device according to claim 1 where one projection is provided on one side only of each inner lead on said first side.

6. A tape carrier package semiconductor device according to claim 1 wherein a projection is provided on both sides of each inner lead on said first side.

7. A tape carrier package semiconductor device according to claim 1 wherein the inner leads are bonded at one end to bonding pads on said semiconductor substrate.

8. A tape carrier package semiconductor device according to claim 3 wherein a sealing resin evenly fills the clearance areas.

9. A tape carrier package semiconductor device comprising:

a carrier tape having a device hole;

a semiconductor substrate disposed in said device hole in such a manner that each side of said semiconductor substrate is spaced by substantially the same distance from the respective opposing edges of said device hole;

a plurality of inner leads provided between said semiconductor substrate and said carrier tape, a projection provided on one side of each inner lead adjacent a larger interspace disposed between some of the inner leads arrayed, and extending into the larger interspace provided in the area between one side of said semiconductor substrate and the opposing edge of said device hole.

10. A tape carrier package semiconductor device according to claim 9 wherein inner leads on the other side of said semiconductor substrate have at least one projection in the area between said semiconductor substrate and the opposing edge of said device hole.

11. A tape carrier package semiconductor device according to claim 10 wherein the total interspace area between the inner leads on one side of said semiconductor substrate, taking into account the area occupied by the projections, is substantially the same as the total interspace area between the inner leads on the other side of said semiconductor substrate, taking into account the area occupied by the projections.

12. A tape carrier package semiconductor device according to claim 11 wherein a sealing resin evenly fills the interspace areas.

* * * * *